United States Patent
Takeishi (10) Patent No.: US 6,256,085 B1
(45) Date of Patent: Jul. 3, 2001

(54) EXPOSURE APPARATUS

(75) Inventor: Hiroaki Takeishi, Utsunomiya (JP)

(73) Assignee: Canon Kabushiki Kaishi, Tokyo (JP)

( * ) Notice: Subject to any disclaimer, the term of this patent is extended or adjusted under 35 U.S.C. 154(b) by 0 days.

(21) Appl. No.: 09/427,744

(22) Filed: Oct. 27, 1999

(30) Foreign Application Priority Data

Oct. 30, 1998 (JP) .................................................. 10-324457

(51) Int. Cl.$^7$ ............................ G03B 27/42; H02K 41/00
(52) U.S. Cl. ............................................. 355/53; 318/135
(58) Field of Search ........................ 355/53, 67, 72–76; 356/399–401; 318/135, 671, 687; 250/548

(56) References Cited

U.S. PATENT DOCUMENTS

| | | | |
|---|---|---|---|
| 5,272,501 | * 12/1993 | Nishi et al. | 355/53 |
| 5,726,542 | * 3/1998 | Ebihara | 318/35 |
| 5,757,149 | * 5/1998 | Sato et al. | 318/135 |
| 6,038,013 | * 3/2000 | Ohsaki | 355/53 |
| 6,080,517 | * 6/2000 | Miyachi | 430/30 |

FOREIGN PATENT DOCUMENTS 5-21314    1/1993    (JP) .

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

An exposure apparatus optically transfers a pattern drawn on an original plate onto an exposure target. When positioning a stage, which is movable with an exposure target or original plate being mounted thereon, the coordinate origin as the reference is switched, when necessary, to match the operating state of the apparatus. The stage is positioned with reference to coordinate information having this coordinate origin as the reference.

6 Claims, 5 Drawing Sheets

EXPOSURE APPARATUS

BACKGROUND OF THE INVENTION

The present invention relates to an exposure apparatus for manufacturing devices such as semiconductor elements and liquid crystal elements.

Figure 2:
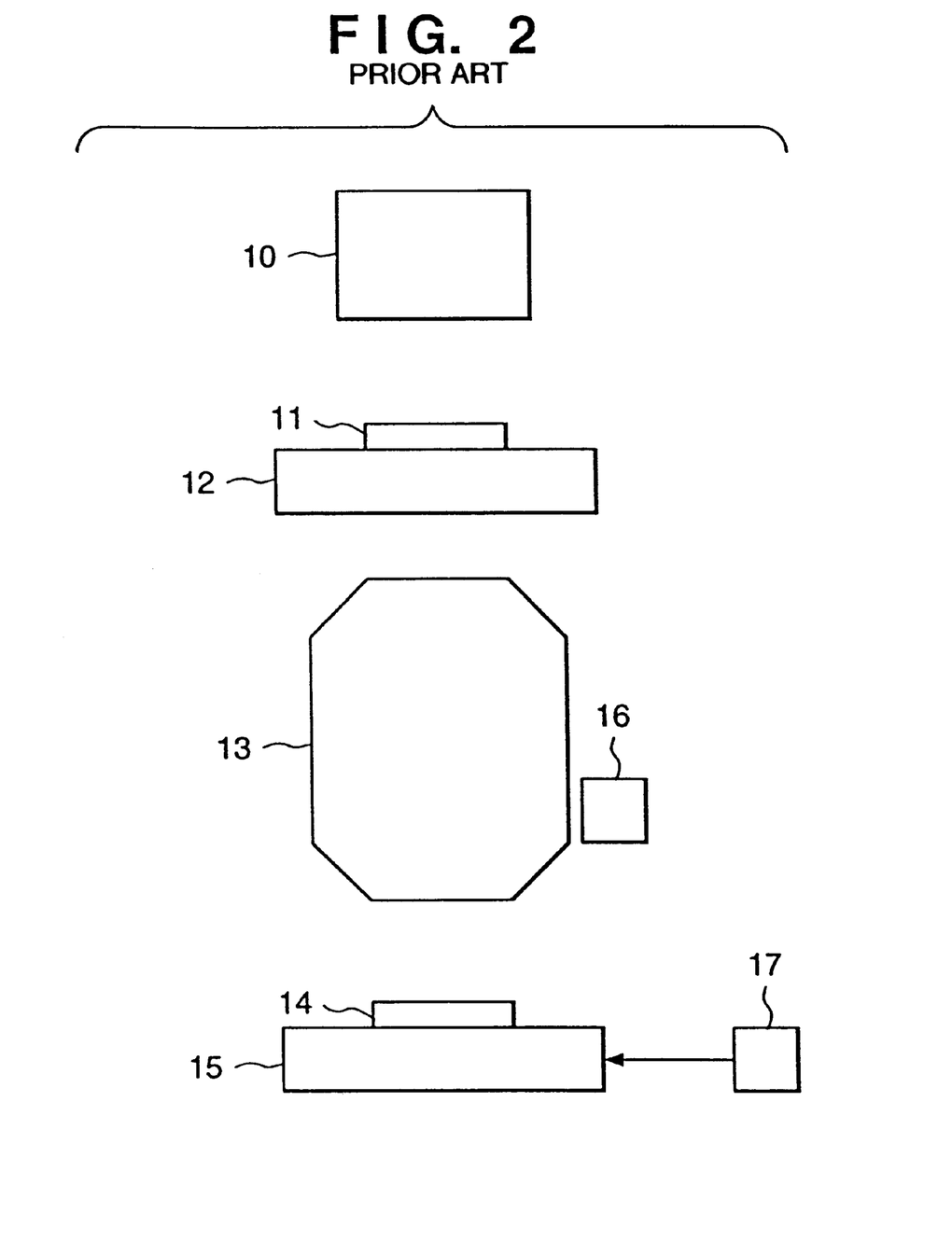
FIG. 2 is a diagram showing the schematic arrangement of a semiconductor exposure apparatus.

FIG. 2 shows the schematic arrangement of a conventional semiconductor exposure apparatus. Referring to FIG. 2, reference numeral 10 denotes an illumination optical unit; 11, a reticle (original plate); 12, a reticle stage; 13, a projection optical unit; 14, a wafer (exposure target); and 15, a wafer stage. The illumination optical unit 10 includes an exposure light source. As the light source, a mercury lamp, a KrF excimer laser, or the like is used. A circuit pattern to be exposed is drawn on the glass surface of the reticle 11. The reticle 11 is mounted on the reticle stage 12. The pattern of the reticle 11 is to be transferred to the wafer 14. The wafer stage 15 can move with the wafer 14 being mounted on it.

The operation of the exposure apparatus will be described. Light from the illumination optical unit 10 is guided to the reticle 11 positioned by the reticle stage 12, is transmitted through the projection optical unit 13, and is transferred (exposed) onto the wafer 14. In the exposure apparatus, the wafer stage 15 performs positioning at a desired position within a plane. When the above exposure is repeated, the pattern of the reticle 11 is exposed onto the wafer 14 a plurality of times.

Usually, a semiconductor element is fabricated not by only exposure using one reticle 11, but by performing exposure a plurality of times in an overlapping manner on the same wafer while exchanging the reticle 11. For this purpose, the wafer once exposed must be mounted on the wafer stage 15 again and be precisely aligned with the reticle 11. The semiconductor exposure apparatus has an aligning function for this. According to a typical method, an alignment mark used for alignment is exposed in advance, and this alignment mark is observed with a microscope 16, thereby performing alignment.

In both exposure and alignment described above, the positions of the reticle stage 12 and wafer stage 15 must be held precisely. If a positioning error is large, the circuit pattern is transferred to be displaced from the pattern on the reticle, so desired circuit characteristics cannot be obtained. The same inconvenience also occurs when a positioning error occurs during alignment. Therefore, the positioning performance of the two stages is a significant performance index directly associated with the performance of the exposure apparatus.

Figure 3:
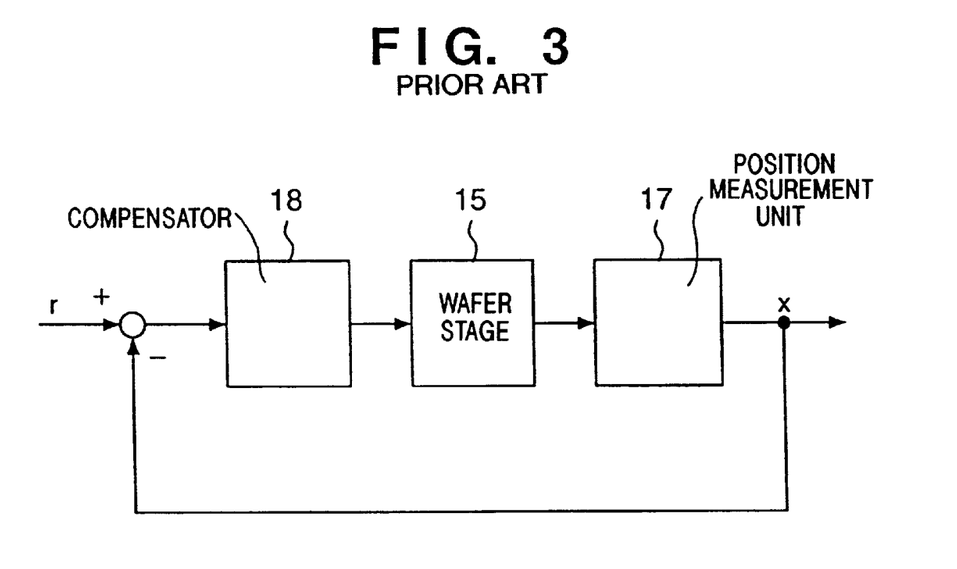
FIG. 3 is a block diagram of a conventional positioning control unit.

Each stage is positioned within the plane by positioning control performed by a position measurement unit 17 using a laser interferometer or the like. FIG. 3 is an illustration of a positioning control unit. The positioning control unit is constituted by a feedback loop. In the feedback loop, a difference between position information x obtained by the position measurement unit 17 and a target position r is calculated. The calculated difference is subjected to an appropriate compensating calculation by a compensator 18 to form a drive instruction value for the wafer stage 15. Along with the recent development of microprocessors, this feedback loop is often constituted by a software servo mainly including a digital filter.

Generally, the measurement axis of the position measurement unit 17 is arranged to coincide with the optical central position constituted by the projection optical unit 13, i.e., the exposure center. This is because the exposed position must be held precisely. In other words, for example, the wafer stage 15 is controlled on a coordinate system having an exposure central position as the reference.

A case wherein a disturbance is applied to the wafer stage 15 will be considered. For example, the vibration of the building where the exposure apparatus is installed, or a reaction produced when the wafer stage 15 itself moves, may excite the main body structure on which the wafer stage is mounted (i.e., the position measurement unit 17). Such a disturbance includes not only a component of one direction but also a translational component and a rotational component. Even if only a translational component is applied as the disturbance, a disturbance in a rotational direction is sometimes excited as another component. Inversely, even if only a rotational component is applied as the disturbance, a disturbance in a translational direction is sometimes excited as another component.

When these disturbance components are generated, the wafer stage 15 operates to suppress them with the feedback loop. According to the basic performance of the exposure apparatus, a sufficiently high positioning performance must be guaranteed even when a disturbance of a certain degree is applied.

As described above, the disturbance is suppressed merely with reference to the exposure center. Accordingly, a sufficiently high positioning performance is guaranteed only from the viewpoint of the exposure central position.

Concerning alignment, it is often performed through observation of an alignment mark on an axis not coinciding with the exposure center, as described in the prior art. In this case, the alignment precision is regulated by the positioning performance with reference to the alignment mark observation position.

A case wherein a disturbance in a rotational direction is applied during alignment will be considered. Even if a sufficiently high positioning precision is obtained with reference to the exposure central position, it cannot be necessarily obtained at the mark observation position. This is because of the following reason. Assume that a positioning precision in a rotational direction at the exposure central position is guaranteed within a target value ±0.1 ppm. If the distance between the exposure central position and the mark observation position is 50 mm, since the rotational angle is small, an approximate calculation reveals that an alignment error or an error from an observation result of $50 \times 0.1 \times 10^{-6} = 5$ nm occurs. In this manner, to guarantee a sufficiently high positioning precision on a coordinate system having the exposure center as the reference does not directly guarantee completely the same precision in alignment, leading to a problem.

SUMMARY OF THE INVENTION

The present invention has been made in consideration of the problems of the prior art described above, and has as its object to provide an exposure apparatus which can guarantee a uniform positioning precision regardless of the operating state of the apparatus. In order to achieve this object, the exposure apparatus according to the present invention has the following arrangement.

That is, there is provided an exposure apparatus for optically transferring a pattern drawn on an original plate onto an exposure target, comprising means for determining an operating state of the apparatus to determine a coordinate origin as a reference when positioning an exposure target stage which is movable with an exposure target being mounted thereon, means for switching the coordinate origin as the positioning reference, when necessary, that matches an operation of the apparatus on the basis of determination, and means for controlling positioning of the exposure target stage in accordance with coordinate information with reference to the switched coordinate origin.

There is also provided an exposure apparatus for optically transferring a pattern drawn on an original plate onto an exposure target, comprising means for determining an operating state of the apparatus to determine a coordinate origin as a reference when positioning an original plate stage which is movable with an original plate being mounted thereon, means for switching the coordinate origin as the positioning reference, when necessary, that matches an operation of the apparatus on the basis of determination, and means for controlling positioning of the original plate stage in accordance with coordinate information with reference to the switched coordinate origin.

There is also provided a device manufacturing method of manufacturing a device by using an exposure apparatus, comprising the steps of preparing the exposure apparatus described above, and performing exposure by using the exposure apparatus.

According to one preferred aspect of the present invention, there is provided an exposure apparatus wherein the operation of the apparatus includes alignment for aligning the original plate and the exposure target relative with each other, and exposure for exposing the pattern drawn on the original plate onto the exposure target.

According to another preferred aspect of the present invention, there is provided an exposure apparatus wherein the operation of the apparatus includes alignment for aligning the original plate at a predetermined position of the apparatus, and exposure for exposing the pattern drawn on the original plate onto the exposure target.

According to the present invention, in any operating state of the apparatus, e.g., during exposure or alignment, the original plate stage and the exposure target stage can be made robust against a disturbance. Accordingly, a completely uniform positioning precision can be guaranteed for the respective stages regardless of the operating state, so that the performance of the exposure apparatus can be remarkably improved.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

According to one preferred embodiment of the present invention, there is provided a semiconductor exposure apparatus for forming a semiconductor element by optically transferring a pattern drawn on a reticle onto a wafer, characterized in that a coordinate origin as a reference of coordinate information of a wafer stage referred to when the wafer stage, which can move with a wafer being mounted on it, is to be positioned, is switched when necessary in accordance with the operating state of the apparatus, and positioning control is performed on the basis of the coordinate information having the switched coordinate origin as the reference.

According to another preferred embodiment of the present invention, there is provided a semiconductor exposure apparatus for forming a semiconductor element by optically transferring a pattern drawn on a reticle onto a wafer, characterized in that a coordinate origin as a reference of coordinate information of a reticle stage referred to when the reticle stage, which can move with a reticle being mounted on it, is to be positioned, is switched when necessary in accordance with the operating state of the apparatus, and positioning control is performed on the basis of the coordinate information having the switched coordinate origin as the reference.

More specifically, the semiconductor exposure apparatus comprises a unit for determining whether the apparatus is performing exposure or alignment, and a unit for switching the reference origin of a coordinate system in accordance with the determination result, and changes a stage positioning control algorithm in accordance with the switched coordinate reference. As a result, a uniform positioning precision can be guaranteed in both exposure and alignment, so that the performance of the exposure apparatus can be improved.

(First Embodiment)

Figure 1:
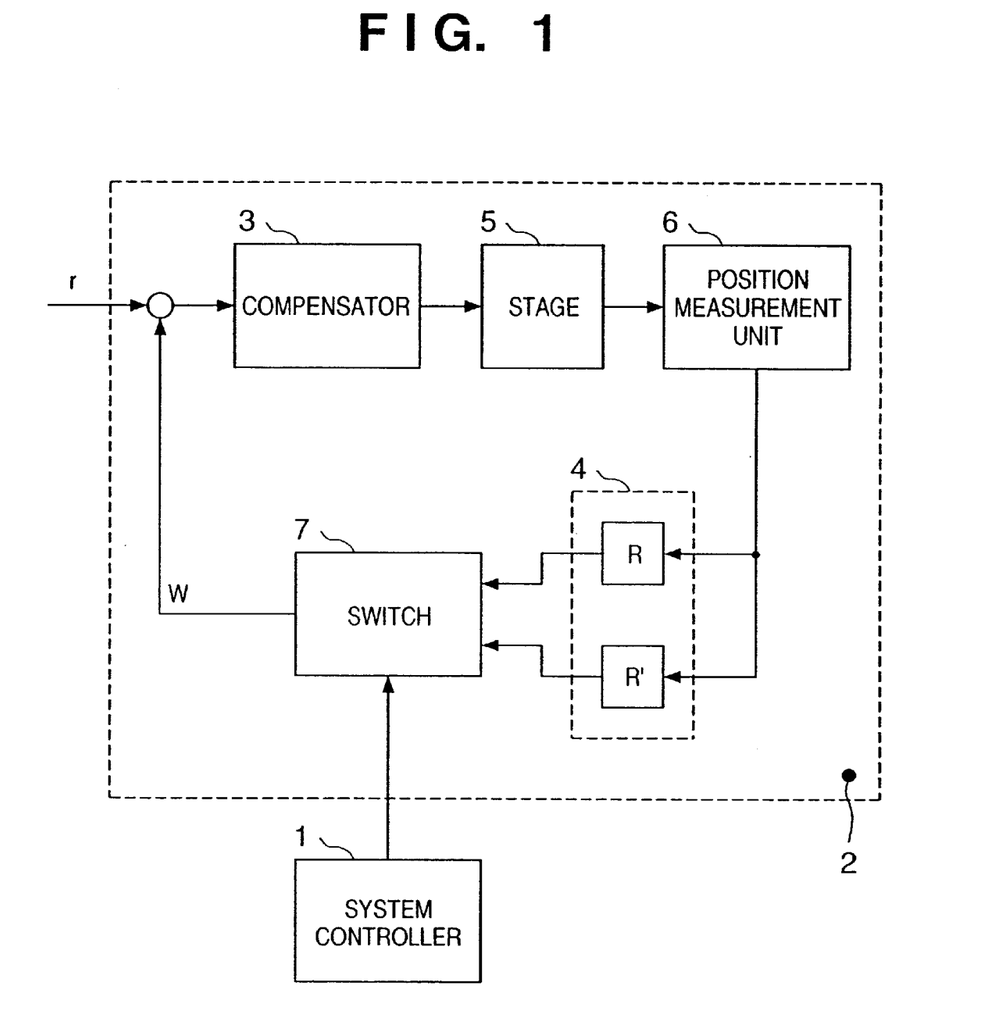
FIG. 1 is a block diagram of a positioning control unit according to an embodiment of the present invention.

An exposure apparatus according to the first embodiment of the present invention will be described with reference to FIG. 1. Referring to FIG. 1, reference numeral 1 denotes a system controller; and 2, a stage positioning control unit. The system controller 1 holds all information realized in the exposure apparatus. The stage positioning control unit 2 is comprised of a compensator 3, coordinate transformer 4, and wafer stage 5 as a control target. Reference numeral 6 denotes a position measurement unit such as a laser interferometer. The position measurement unit 6 measures the position of the stage with reference to the exposure central position. For the sake of descriptive simplicity, in this embodiment, the reticle stage is assumed to be positioned at a desired position with a sufficiently high precision. A description will be made only on the wafer stage.

In this embodiment, the algorithm in the coordinate transformer 4 is switched when necessary on the basis of the stage operation information of the system controller 1. This coordinate transformation will be described in detail.

A case wherein the system is performing exposure will be described. At this time, the wafer stage 5 must guarantee the positioning precision with reference to the exposure center. Since the position measurement unit 6 is arranged such that the exposure central position and the measurement unit coincide with each other, pieces of coordinate information x, y, and θ within a plane obtained by the position measurement unit 6 directly represent the wafer stage coordinates $x_w$, $y_w$, and $\theta_w$ with reference to the exposure center. Therefore, in this case, the coordinates of the wafer stage with reference to the exposure central position and the pieces of coordinate information obtained by the position measurement unit 6 have the relationship expressed by equation (1) by using a transformation matrix R. In equation (1), T indicates transportation.

$$[x_w \ y_w \ \theta_w]^T = R[x \ y \ \theta]^T \qquad (1)$$

$$R = \begin{bmatrix} 1 & 0 & 0 \\ 0 & 1 & 0 \\ 0 & 0 & 1 \end{bmatrix}$$

A case wherein the system is performing alignment will be described. At this time, the wafer stage 5 must be positioned to a position where the positioning mark on it can be observed with a microscope (not shown; corresponding to the microscope 16 of FIG. 2) used for alignment. Assuming that the x-y direction relative coordinates (vector) of the microscope and the exposure central position are [Lx Ly], wafer stage coordinates $x_w$, $y_w$, and $\theta_w$ of this position can be expressed as in equation (2) in the same manner as in equation (1) by using the transformation matrix R:

$$[x_w \ y_w \ \theta_w]^T = R'[x \ y \ \theta]^T \qquad (2)$$

$$R' = \begin{bmatrix} 1 & 0 & L_y \\ 0 & 1 & L_x \\ 0 & 0 & 1 \end{bmatrix}$$

$$\tan\theta \approx \theta$$

Whether the exposure apparatus is performing exposure or alignment is determined by the system controller 1. In response to this determination result, the coordinate transformer 4 selects either equation (1) or (2) and transforms it to a coordinate system serving as a reference. The stage positioning control unit 2 performs a stage positioning control calculation matching the operation mode (exposure or alignment) in accordance with the reference coordinate system transformed by the coordinate transformer 4.

Through these processes, the wafer stage 5 can move, during exposure, on the coordinate system having the exposure center as the reference, and during alignment, on the coordinate system having the positioning mark observation position as the reference. Therefore, a uniform positioning precision can be guaranteed in both exposure and alignment, so that an improvement in performance of the exposure apparatus can be achieved.

(Second Embodiment)

Although the measurement axis of the position measurement unit 6 and the exposure central position coincide with each other in the first embodiment, they need not always coincide with each other. In this case, in equation (1) for calculating the stage coordinate values with reference to the exposure center, the transformation matrix R may be corrected on the basis of the relative coordinate values of a position measurement unit 6 and the exposure central position, in the same manner as in equation (2), such that the stage coordinate values with reference to the exposure center can be calculated.

(Third Embodiment)

In the first embodiment, the movement of the wafer stage is mainly described. This movement applies to a reticle stage. If the position of the reticle stage differs between a case of aligning a reticle and a case of performing exposure, the same method as that of the above embodiment can be employed.

(Embodiment of Device Manufacturing Method)

An embodiment of a device manufacturing method utilizing the exposure apparatus described above will be described.

Figure 4:
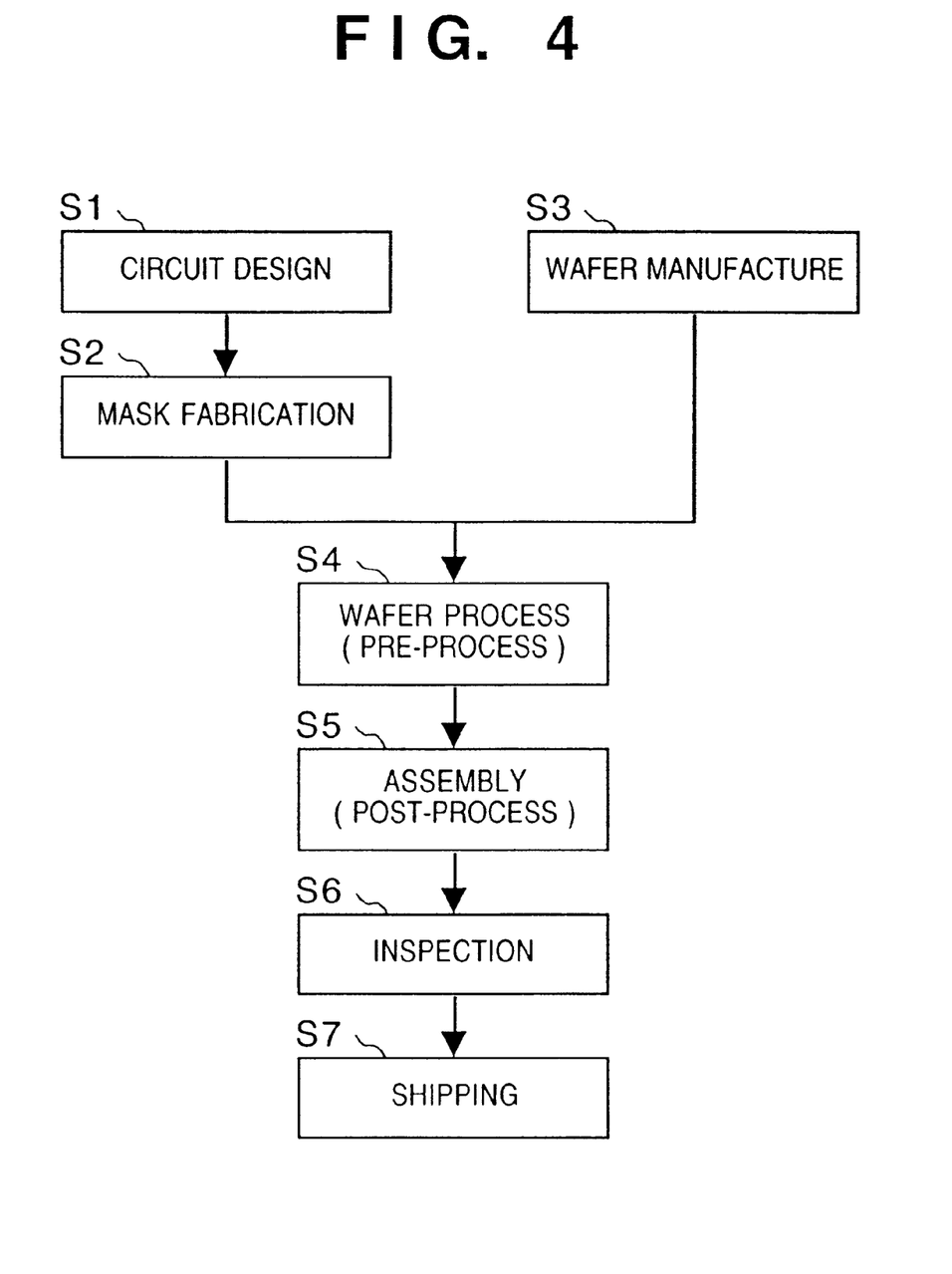
FIG. 4 is a flow chart showing the flow of the manufacture of a microdevice.

FIG. 4 shows the flow of the manufacture of a microdevice (a semiconductor chip such as an IC or LSI, a liquid crystal panel, a CCD, a thin film magnetic head, a micromachine, or the like). In step 1 (circuit design), pattern design of the device is performed. In step 2 (mask fabrication), a mask formed with the designed pattern is fabricated. In step 3 (wafer manufacture), a wafer is manufactured by using a material such as silicon or glass. Step 4 (wafer process) is called a pre-process wherein the mask and wafer prepared above are used to form an actual circuit on the wafer in accordance with lithography. Step 5 (assembly) is called a post-process wherein the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device fabricated in step 5 is performed. The semiconductor device is completed through these steps, and is shipped (step 7).

Figure 5:
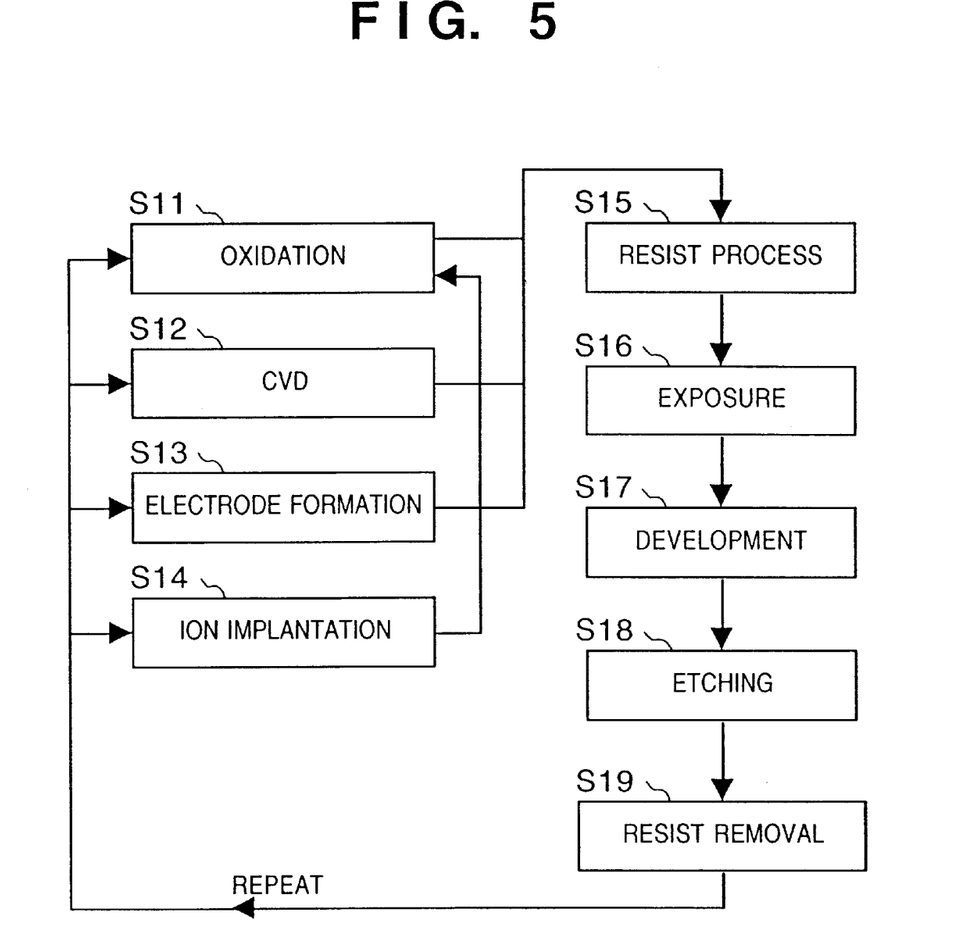
FIG. 5 is a flow chart showing the flow of the wafer process of FIG. 4 in detail.

FIG. 5 shows a detailed flow of the above wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photosensitive agent is applied to the wafer. In step 16 (exposure), the circuit pattern of the mask is printed onto the wafer and exposed by the exposure apparatus described above. In step 17 (development), the exposed wafer is developed. In step 18 (etching), a portion other than the developed resist image is removed. In step 19 (resist removal), the resist which has become unnecessary after etching is removed. These steps are repeatedly performed to form circuit patterns on the wafer in a multiple manner.

When the manufacturing method of this embodiment is used, a high-integration device which is conventionally difficult to manufacture can be manufactured at a low cost.

As has been described above, with the exposure apparatus according to the present invention, the original plate stage and the exposure target stage can be made robust against a disturbance in both exposure and alignment. A completely uniform positioning precision can be guaranteed regardless of the operating states of the respective stages, so that the performance of the exposure apparatus can be remarkably improved.

The present invention is not limited to the above embodiments and various changes and modifications can be made within the spirit and scope of the present invention. Therefore, to appraise the public of the scope of the present invention, the following claims are made.

What is claimed is:

1. An exposure apparatus for optically transferring a pattern drawn on an original plate onto an exposure target, said apparatus comprising:

means for determining an operating state of said apparatus to determine a coordinate origin as a reference when positioning an exposure target stages which is movable with an exposure target being mounted thereon;

means for switching the coordinate origin as the positioning reference that matches an operation of said apparatus on the basis of the determination; and means for controlling positioning of the exposure target stage in accordance with coordinate information with reference to the switched coordinate origin.

2. The apparatus according to claim 1, further comprising an alignment device for aligning the original plate and the exposure target relative to each other, and an exposure device for exposing the pattern drawn on the original plate onto the exposure target.

3. An exposure apparatus for optically transferring a pattern drawn on an original plate onto an exposure target, said apparatus comprising:

means for determining an operating state of said apparatus to determine a coordinate origin as a reference when positioning an original plate stage, which is movable with an original plate being mounted thereon;

means for switching the coordinate origin as the positioning reference that matches an operation of said apparatus on the basis of the determination; and means for controlling positioning of the original plate stage in accordance with coordinate information with reference to the switched coordinate origin.

4. The apparatus according to claim 3, further comprising an alignment device for aligning the original plate at a predetermined position of said apparatus, and an exposure device for exposing the pattern drawn on the original plate onto the exposure target.

5. A device manufacturing method of manufacturing a device by using an exposure apparatus, said method comprising the steps of:

determining an operating state of the apparatus to determine a coordinate origin as a reference when positioning an exposure target stage, which is movable with an exposure target being mounted thereon;

switching the coordinate origin as the positioning reference that matches an operation of the apparatus on the basis of the determination;

controlling positioning of the exposure target stage in accordance with coordinate information with reference to the switched coordinate origin; and performing exposure by optically transferring a pattern drawn on the original plate onto an exposure target in order to manufacture a device.

6. The method according to claim 5, further comprising aligning the original plate at a predetermined position in order to perform the exposure.

* * * * *

UNITED STATES PATENT AND TRADEMARK OFFICE
CERTIFICATE OF CORRECTION

PATENT NO. : 6,256,085 B1
DATED : July 3, 2001
INVENTOR(S) : Hiroaki Takeishi

It is certified that error appears in the above-identified patent and that said Letters Patent is hereby corrected as shown below:

Column 2,
Line 45, "50 x 0.1 x $10^-$" should read -- 50 x 0.1 x $10^{-6}$ --; and
Line 46, "$_6$=5nm" should read -- =5nm --

Column 5,
Line 16, "[$L_xL_y$]," should read -- [$L_x,L_y$], --.

Column 6,
Line 57, "stages" should read -- stage, --.

Signed and Sealed this

Twenty-fifth Day of June, 2002

Attest:

JAMES E. ROGAN
Attesting Officer  Director of the United States Patent and Trademark Office